United States Patent [19]
Utaka et al.

[11] Patent Number: 4,743,087
[45] Date of Patent: May 10, 1988

[54] OPTICAL EXTERNAL MODULATION SEMICONDUCTOR ELEMENT

[75] Inventors: Katsuyuki Utaka, Musashino; Shigeyuki Akiba; Yukitoshi Kushiro, both of Tokyo; Yukio Noda, Yokohama, all of Japan

[73] Assignee: Kokusai Denshin Denwa Kabushiki Kaisha, Tokyo, Japan

[21] Appl. No.: 739,477

[22] Filed: May 30, 1985

[30] Foreign Application Priority Data

Jun. 7, 1984 [JP] Japan ................. 59-115585

[51] Int. Cl.4 ............................ G02B 6/34; H01S 3/19
[52] U.S. Cl. ................. 350/96.19; 350/96.13; 350/96.14; 372/96
[58] Field of Search ............... 350/96.12, 96.13, 96.14, 350/96.15, 96.19, 96.17; 372/96

[56] References Cited

U.S. PATENT DOCUMENTS

| | | | |
|---|---|---|---|
| 3,831,038 | 8/1974 | Dabby et al. | 350/96.12 X |
| 3,868,589 | 2/1975 | Wang | 372/96 |
| 3,884,549 | 5/1975 | Wang et al. | 350/96.19 X |
| 4,039,249 | 8/1977 | Kaminow et al. | 350/96.13 X |
| 4,273,445 | 6/1981 | Thompson et al. | 350/96.17 X |
| 4,286,838 | 9/1981 | Huignard et al. | 350/96.19 X |
| 4,327,340 | 4/1982 | Coldren | 350/96.12 X |
| 4,622,674 | 11/1986 | Mito | 372/96 X |

Primary Examiner—John Lee
Attorney, Agent, or Firm—Emmanuel J. Lobato; Robert E. Burns

[57] ABSTRACT

An optical modulation element is disclosed in which a diffraction grating is formed along a waveguide for guiding unmodulated incident light and inclined to the direction of travel of the light, and a structure is provided for changing the refractive index of the waveguide portion where the diffraction grating is formed. the refractive index of the waveguide portion can be effected by voltage application, by current injection or by light irradiation.

8 Claims, 5 Drawing Sheets

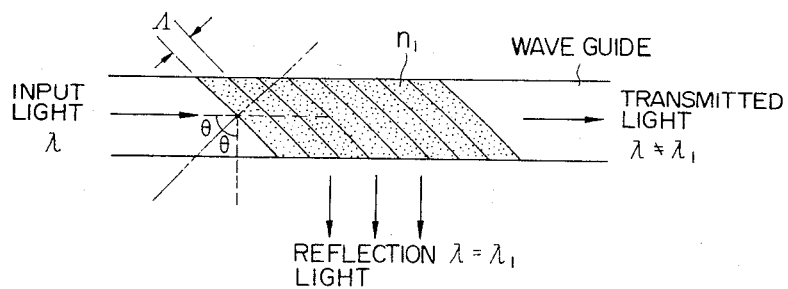
Fig.1A
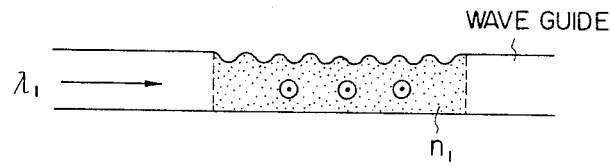
Fig.1B
Fig. 2
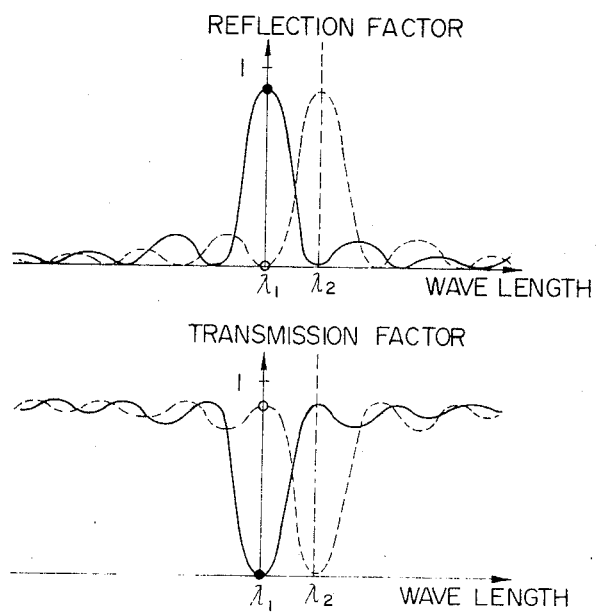

OPTICAL EXTERNAL MODULATION SEMICONDUCTOR ELEMENT

BACKGROUND OF THE INVENTION

The present invention relates to an optical external modulation element.

A semiconductor laser has a small size, high-efficiency and high-reliability, and it has already been put to use as the light source for optical fiber communications. Another noteworthy feature of the semiconductor laser is to permit direct modulation, but high-speed direct modulation causes an increase in the spectral width of the semiconductor laser, constituting a serious obstacle to long-distance, large-capacity optical fiber communication. In particular, an ordinary semiconductor laser utilizing the cleavage plane oscillates at a plural wavelengths during high-speed modulation, and hence it has been employed only in the 1.3 $\mu$m wavelength band in which no wavelength dispersion of the optical fiber occurs but loss is relatively large. On the other hand, a distributed feedback semiconductor laser, which performs a single-wavelength operation during high-speed modulation as well, is insusceptible to the influence of the wavelength dispersion, and it is now being developed intensively for use in the 1.5 $\mu$m band in which loss is small. When the modulation rate exceeds 1 giga bit/sec (Gb/S), however, even if it oscillates at a single wavelength, the spectral width increase owing to a change in the injected carrier density poses a problem that the influence of dispersion is nonnegligible.

Chirping (variation) of the oscillation wavelength or the resulting spread of the spectral width during high-speed modulation is unavoidable as long as the semiconductor laser is subjected to the direct modulation. Then the external modulation technique is considered promising which allows the semiconductor laser to operate at a single wavelength in the steady state and modulates the output light outside the resonator. With the external modulation technique, since the static spectral width ($\leq$ 10 MHz) increases by the modulation band ($\sim$ GHz) alone, the increase in the spectral width can be reduced down to about 1/10 that (1 to 3 Å) in the case of the direct modulation.

As such a conventional waveguide type external modulator, directional coupling type and Mach-Zender interference type structures utilizing a ferrodielectric material are mainly attracting attention in terms of the modulation band and the extinction ratio. However, these modulators performs intensity modulation of light by changing its phase velocity, and hence are defective in that they must be fabricated uniformly and precisely controlling the dimensions of the waveguide, that the modulation element is as long as several milimeters to several centimeters and that the insertion loss is also large.

SUMMARY OF THE INVENTION

In view of the abovesaid shortcomings of the prior art, an object of the present invention is to provide an optical external modulation element which achieves a large extinction ratio, a wide modulation band and short element length and can be integrated together with a semiconductor laser.

To attain the above object, the optical modulation element of the present invention is equipped with a diffraction grating provided along a waveguide for guiding unmodulated incident light and inclined to the direction of travel of the light, and is arranged so that the refractive index of the waveguide portion in which the diffraction grating is formed is varied by an external input such as voltage or current application.

BRIEF DESCRIPTION OF THE ACCOMPANYING DRAWINGS

The present invention will be described in detail below with reference to the accompanying drawings, in which:

FIGS. 1A and 1B are a top view and a plan view of an external waveguide having formed thereon an oblique diffraction grating which is the basic structure of the present invention;

FIG. 2 is a graph showing how the Bragg wavelength of the oblique diffraction grating shifts with variations in the refractive index of the waveguide and how incident light of a particular wavelength it reflected and transmitted; and FIGS. 3, 4, 5 and 6 are perspective views illustrating embodiments of the present invention in which the optical modulation element of the present invention is integrated together with a DFB laser.

DETAILED DESCRIPTION

With reference to FIG. 1 illustrating the basic structure of the optical external mdoulator of the present invention, a diffraction grating is formed along a waveguide at an angle $\theta$ to the direction of travel of incident light. Letting the period of the diffraction grating be represented by $\Lambda$ and the refractive index of the waveguide portion in which the diffraction grating is formed be represented by $n_1$, incident light of the Bragg wavelength which satisfies the condition $\lambda_1 = 2n_1 \Lambda \cos\theta$ is radiated in a direction at an angle of $2\theta$ to the direction of travel of the incident light. Now, if the angle $\theta$ is selected approximately 45°, the direction of radiation of the reflected light will become substantially perpendicular to the waveguide, and the light is no longer guided and is not output as transmitted light. The wavelength characteristics of reflectivity and transmittivity of the diffraction grating aslant to the incident light are indicated by the solid lines in FIG. 2. In FIG. 2, $\lambda_1$ is the Bragg wavelength, at which the reflectivity is maximum, and consequently, the transmittivity becomes zero. On the other hand, at the other wavelengths the reflectivity diminishes; in particular, there exist wavelengths at which the reflectivity is markedly low due to the interference effect by the diffraction grating. In FIG. 2, the broken lines indicate wavelength characteristics in the case where the refractive index of the waveguide was changed to $n_2$ ($>n_1$) and the Bragg wavelength was shifted from $\lambda_1$ to $\lambda_2$ ($=2n_2 \Lambda \cos\theta$). In this case, by changing the refractive index of the waveguide so that the wavelength in the vicinity of the Bragg wavelength at which the transmittivity becomes maximum agrees with the Bragg wavelength $\lambda_1$ before the refractive index is changed, it is possible to switch the reflection to the transmission mode for the fixed incident light $\lambda_1$. The black circles indicate the OFF state and the white circles the ON state. That is, intensity-modulated transmitted light can be obtained by changing the refractive index of the waveguide. Further, FS modulation can also be achieved by using two different wavelengths $\lambda_1$ and $\lambda_2$.

EMBODIMENT 1

Figure 3:
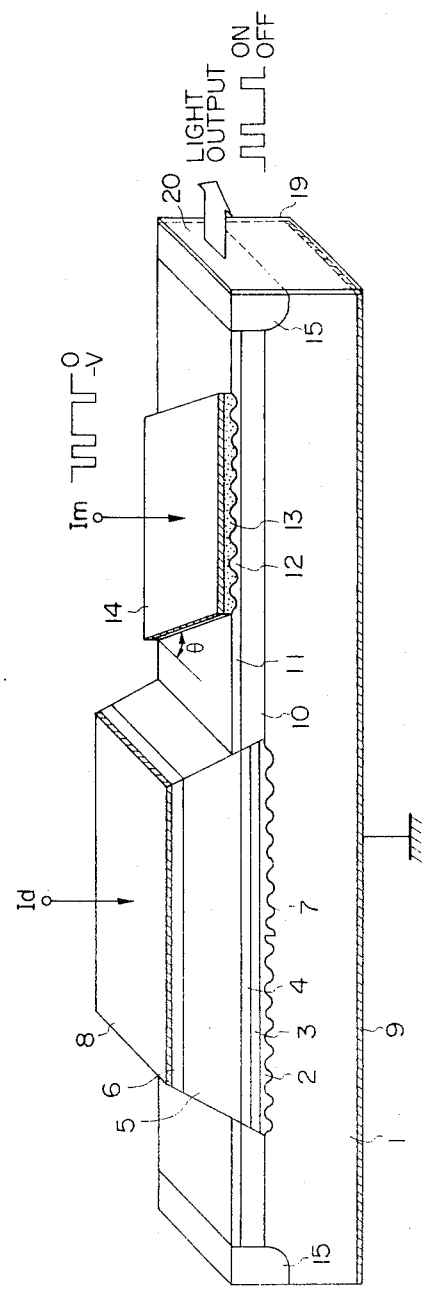

FIG. 3 illustrates the first embodiment in which the optical modulation element of the present invention described above is integrated as a specific external modulation element together with a DFB laser, and in which the reflective index of the waveguide is changed by means of voltage application. Reference numeral 1 indicates an n-type InP substrate, 2 an n-type InGaAsP waveguide layer, 3 an InGaAsP active layer, 4 a p-type InGaAsP buffer layer, 5 a p-type InP cladding layer, 6 a p-type InGaAsP cap layer, 7 a diffraction grating which has its phase shifted by ¼ of the guide wavelength at the center thereof, and 8 and 9 p-side and n-side electrodes. By applying a DC-current via the electrode 8, the region in which the diffraction grating 7 is provided oscillates as the DFB laser. In this case, the abovesaid region performs a stable single-wavelength oscillation at the Bragg wavelength which depends upon the period of the diffraction grating 7, and its spectral width is as narrow as several MHz or less. The output light from the DFB laser propagates in the InGaAsP layer 10 which is a low-loss external waveguide. The optical modulation element of the present invention is provided in an external waveguide region. An oblique diffraction grating 12 is formed on an InP layer 11. Reference numeral 13 designates an insulating film and 14 an electrode provided on the oblique diffraction grating 14 for voltage application. The period of the diffraction grating 12 is selected such that the oscillation wavelength of the DFB laser agrees with the Bragg wavelength when no voltage is being applied. Accordingly, when no voltage is being applied, no light is emitted from the element end face 20, as described previously. Now, applying voltage to the electrode 14, the refractive index of the waveguide layer 10 varies by virtue of the electro-optic effect and the Bragg wavelength of the diffraction grating 12 is shifted. In this instance, by applying such a voltage that maximizes the transmittance for a fixed incident light, output light is emitted from the element end face 20. In this way, the light output is intensity modulated in accordance with the voltage of the modulation element. In this case, since carriers in the active layer 3 of the DFB laser are constant in the steady state, the spectral width of the output light increases only by the modulation band, and even if the modulation rate is several Gb/S, the spectral width is less than 1 Å. Reference numeral 15 identifies an InP window region for suppressing reflection from the end face 20. The InP window region 15 may be changed to an antireflection coating film 19, or a combination of the InP region 15 and the film 19. Further, while the MIS structure is shown as the structure for applying an electric field to the waveguide layer, it is also possible to obtain the same effects with a structure which applies a reverse bias to a PN junction.

EMBODIMENT 2

Figure 4:
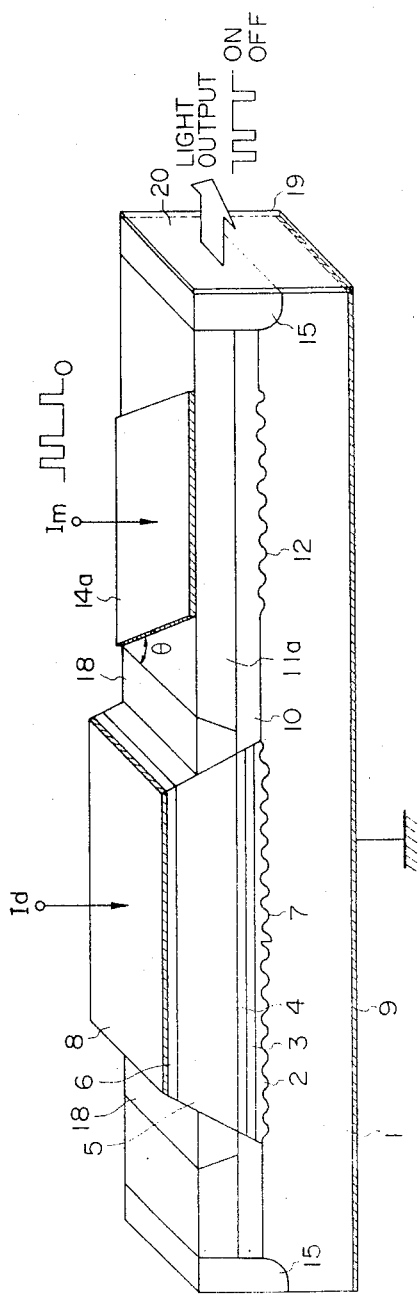

FIG. 4 illustrates the second embodiment of the present invention, which differs from the embodiment of FIG. 3 in that the refractive index of the external waveguide is changed by means of carrier injection. Reference numeral 11a indicates a p-type InP clad layer and 14a an electrode. The modulation current is effectively injected into an InGaAsP external waveguide layer 10 of a small energy gap. Since the injected carriers gives rise to a change in the refractive index, the Bragg wavelength by the diffraction grating 12 shifts with the change in the refractive index. Incidentally, since the carrier injection is accompanied by an increase in the absorption loss, a larger dynamic range can be obtained by determining the period of the diffraction grating 12 so that when the modulation current $I_m$ is ON, the light output is OFF.

EMBODIMENT 3

Figure 5:
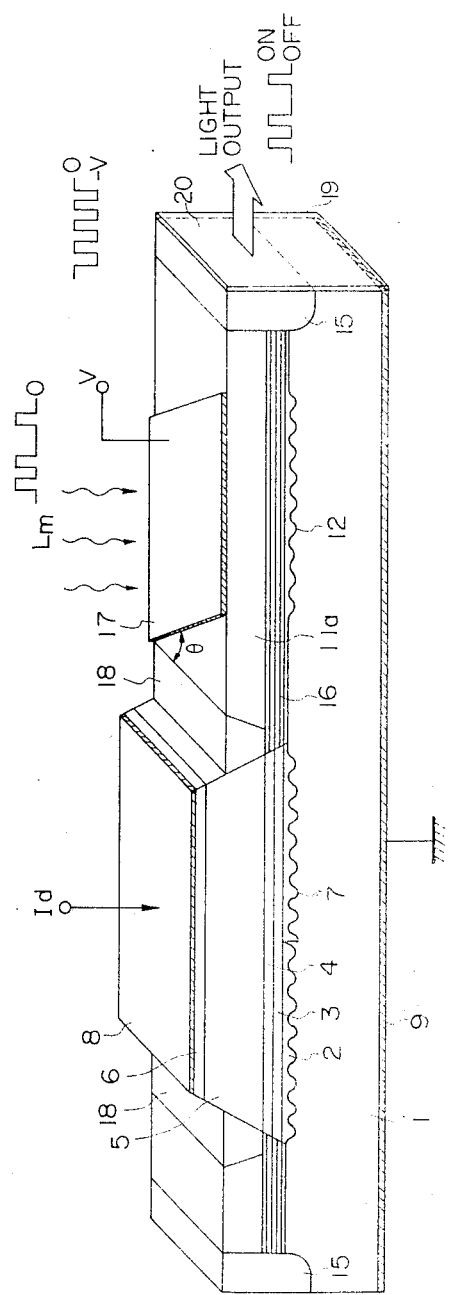

FIG. 5 illustrates the third embodiment of the present invention, which is designed to obtain a modulated light by light irradition. The period of the diffraction grating 12 is selected so that no light is output when no modulation light is applied. An external waveguide 16 is formed to have an MQW (Multiple Quantum Well) structure. When the diffraction grating 12 is irradiated, through a transparent electrode 17, by modulation light $L_m$ which is in agreement with the peak wavelength of excitons in the MQW structure, the refractive index varies owing to substantial nonlinearity unique to the MQW structure. In consequence, the Bragg wavelength of the diffraction grating 12 shifts, producing transmitted light. Incidentally, a time of 10 ns or so is usually needed for relaxation of exciton absorption, but by applying a reverse bias ($-V$) to the PN junction at the boundary of the waveguide across electrodes 9 and 17 at the end of each time slot to thereby deplete carriers, a fast response can be expected. By applying the modulation light $L_m$ in the lateral direction, the same effects can be obtained.

EMBODIMENT 4

Figure 6:
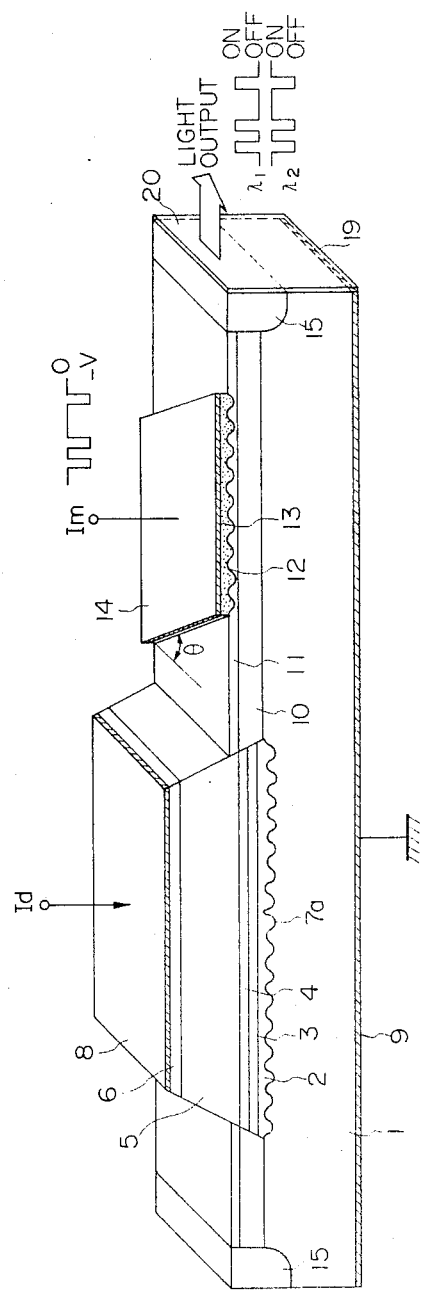

FIG. 6 illustrates the fourth embodiment of the present invention, which is adapted to perform FS modulation by controlling the refractive index of the waveguide so that the reflectivities and transmittivities at the wavelengths $\lambda_1$ and $\lambda_2$ may be exchanged with each other.

In FIG. 6, reference numeral 7a indicates a diffraction grating which has no phase inversion at the center thereof, and except this the illustrated embodiment is exactly identical with the embodiment of FIG. 3. That is, a DFB laser which employs the diffraction grating 7a with no phase inversion is used as a two-wavelength oscillation semiconductor laser.

FS-modulated output light can be obtained by changing the refractive indexes $n_1$ and $n_2$ by the voltage applied to the modulation electrode 14 so that when the reflectivity at the wavelength $\lambda_2$ is highest, the reflectivity at the wavelength $\lambda_1$ is lowest, whereas when the transmittivity at the wavelength $\lambda_2$ is highest, the transmittivity at the wavelength $\lambda_1$ is lowest, as shown in FIG. 2.

While in the above the refractive index is changed by applying voltage, it can also be achieved by current injection or light irradiation. Further, the DFB laser using the diffraction grating 7a having no phase inversion is exemplified as a two-wavelength oscillation semiconductor laser in the above, but the invention is applicable to any other semiconductor lasers which oscillate at two wavelengths.

Although the present invention has been described, for the sake of brevity, as being applied to the broad electrode structure, the invention is also applicable to various stripe structures which are intended for stabilization of the lateral mode, such as a buried heterostructure. Moreover, the materials used are not limited specifically to the InGaAsP series but may also be of the AlGaInAs, AlGaAsSb and AlGaAs systems.

As described above in detail, by providing a diffraction grating inclined as desired and by changing the refractive index of the waveguide region in which the diffraction grating is formed, as proposed by the present invention, it is possible to materialize an external modulation element which is small in the spectral width and capable of a high-speed operation, produces modulated light of a high extinction ratio and is easy of fabrication and can be integrated together with a laser. Accordingly, the external modulation element of the present invention is suitable for use in the light source for long-distance, large-capacity optical fiber communications, and hence is of great utility.

What we claim is:

1. An optical external modulation semiconductor element integrally associated with a distributed feedback (DFB) semiconductor laser, comprising: means external to the DFB laser for defining a waveguide portion integral with said DFB laser having formed therein a diffraction grating of fixed period having a Bragg wavelength substantially equal to the wavelength of an output light from the distributed feedback semiconductor laser and formed along said waveguide portion for guiding unmodulated incident light radiated from the distributed feedback semiconductor laser to be inclined to the direction of travel of the light; and means on the waveguide portion for, without need of a temperature dependence, changing at will during operation the refractive index of the waveguide portion in which the diffraction grating is formed for modulating the intensity of output light of the laser.

2. An optical external modulation semiconductor element according to claim 1, in which said DFB laser has a diffraction grating without phase inversion at the center thereof, and in which the DFB laser is a two-wavelength oscillation semiconductor laser.

3. An optical external modulation semiconductor element according to claim 1, in which said DFB laser has a diffraction grating having its phase shifted by $\frac{1}{4}$ of the waveguide portion wavelength.

4. An optical external modulation semiconductor element according to claim 1, in which said means on the waveguide portion comprises means to apply a field to the waveguide for changing the refractive index of the waveguide portion for modulating the intensity of the output light of the laser as a function of the intensity of said field.

5. An external optical modulation semiconductor element integrally associated with a distributed feedback (DFB) semiconductor laser, comprising means external to the DFB laser for defining a waveguide portion integral with said DFB laser having formed therein a diffraction grating of fixed period having a Bragg wavelength substantially equal to the wavelength of an output light from the distributed feedback semiconductor laser and formed along said waveguide portion for guiding unmodulated incident light radiated from the distributed feedback semiconductor laser to be inclined to the direction of travel of the light; and means on the waveguide portion for, without need of a temperature dependence, changing at will the refractive index of the waveguide portion in which the diffraction grating is formed.

6. An optical external modulation semiconductor element integrally associated with a distributed feedback (DFP) semiconductor laser, comprising: means external to the DFB laser for defining a waveguide portion integral with said DFB laser having formed therein a diffraction grating of fixed period having a Bragg wavelength substantially equal to the wavelength of an output light from the distributed feedback semiconductor laser and formed along said waveguide portion for guiding unmodulated incident light radiated from the distributed feedback semiconductor laser to be inclined to the direction of travel of the light; means on the waveguide portion for changing at will during operation the refractive index of the waveguide portion in which the diffraction grating is formed for modulating the intensity of output light of the laser, and said means on the waveguide portion comprising voltage application electrodes to which a voltage is applied for changing at will during operation the refractive index of the waveguide portion.

7. An optical external modulation semiconductor element integrally associated with a distributed feedback (DFB) semiconductor laser, comprising: means external to the DFB laser for defining a waveguide portion integral with said DFB laser having formed therein a diffraction grating of fixed period having a Bragg wavelength substantially equal to the wavelength of an output light from the distributed feedback semiconductor laser and formed along said waveguide portion for guiding unmodulated incident light radiated from the distributed feedback semiconductor laser to be inclined to the direction of travel of the light; means on the waveguide portion for changing at will during operation the refractive index of the waveguide portion in which the diffraction grating is formed for modulating the intensity of output light of the laser, and said means on said waveguide portion comprising current injecting electrodes for injecting carriers for changing at will during operation the refractive index of the waveguide portion.

8. An optical external modulation semiconductor element integrally associated with a distributed feedback (DFB) semiconductor laser, comprising: means external to the DFB laser for defining a waveguide portion integral with said DFB laser having formed therein a diffraction grating of fixed period having a Bragg wavelength substantially equal to the wavelength of an output light from the distributed feedback semiconductor laser and formed along said waveguide portion for guiding unmodulated incident light radiated from the distributed feedback semiconductor laser to be inclined to the direction of travel of the light; means on the waveguide portion for changing at will during operation the refractive index of the waveguide portion in which the diffraction grating is formed for modulating the intensity of output light of the laser, and said means on said waveguide portion comprising light irradiating transparent electrodes to which light is applied for changing at will during operation the refractive index of the waveguide portion.

* * * * *